United States Patent
Ito et al.

(10) Patent No.: US 7,626,275 B2
(45) Date of Patent: Dec. 1, 2009

(54) SEMICONDUCTOR DEVICE

(75) Inventors: Masayasu Ito, Tokyo (JP); Katsumi Miyawaki, Tokyo (JP); Junji Fujino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 248 days.

(21) Appl. No.: 11/530,970

(22) Filed: Sep. 12, 2006

(65) Prior Publication Data
US 2007/0138650 A1    Jun. 21, 2007

(30) Foreign Application Priority Data
Dec. 16, 2005    (JP) .............................. 2005-363730

(51) Int. Cl.
*H01L 23/48*    (2006.01)
*H01L 23/49*    (2006.01)

(52) U.S. Cl. .................. 257/779; 257/750; 257/751; 257/766; 257/777; 257/781; 257/E21.508; 257/E21.51; 257/E23.02; 257/E23.021; 438/612; 438/613; 438/614

(58) Field of Classification Search .............. 257/750, 257/751, 766, 778, 779; 438/612, 613, 614
See application file for complete search history.

(56) References Cited

U.S. PATENT DOCUMENTS

| 4,772,935 | A |   | 9/1988 | Lawler et al. |
| 4,835,593 | A | * | 5/1989 | Arnold et al. ............... 428/210 |
| 5,179,041 | A |   | 1/1993 | Yano et al. |
| 7,304,491 | B2 | * | 12/2007 | Farnworth et al. .......... 324/765 |
| 7,410,833 | B2 | * | 8/2008 | Fogel et al. ................. 438/123 |

FOREIGN PATENT DOCUMENTS

| JP | 57-015432 | 1/1982 |
| JP | 6-7990 | 1/1994 |

* cited by examiner

*Primary Examiner*—Dao H Nguyen
(74) *Attorney, Agent, or Firm*—Leydig, Voit & Mayer, Ltd.

(57) ABSTRACT

A semiconductor device includes a semiconductor substrate, a first metal film on a back surface of the semiconductor substrate, a second metal film on the first metal film, and a third metal film on the second metal film. The first metal film forms an alloy with a solder. The second metal film causes isothermal solidification of the solder. The third metal film improves solder wetting properties or inhibits oxidation. Further, in a method for die-bonding a semiconductor device, a specific metal is diffused into a solder, when the solder melts, to transform the solder into a high melting point alloy, thereby causing isothermal solidification of the solder. The specific metal is different from the metal of the solder.

2 Claims, 3 Drawing Sheets

SEMICONDUCTOR DEVICE

FIELD OF THE INVENTION

The present invention relates to a semiconductor device and a die bonding method therefore. The present invention is preferably used when a semiconductor device is kept at high temperature for a long time during soldering process.

BACKGROUND ART

In the case of a quad flat no-lead (QFN) package manufacturing process that molds a plurality of packages together and that requires the semiconductor chips to be die-bonded by use of a high melting point solder such as AuSn eutectic solder, the chips are usually subjected to elevated temperature for a long time using a heater.

Specifically, the semiconductor chips are exposed to high temperature conditions until their die boding is complete. Therefore, during this die bonding process, the solder as the bonding material is in a liquid state and hence rapidly diffuses. If this diffusion proceeds extremely, the solder may reach the base material of the lead frames beyond the barrier metal, for example. This results in formation of voids within the solder layer, leading to a reduction in the bonding strength and an increase in the thermal resistance.

A conventional method for preventing the solder from diffusing to the base material of the frames is to limit the number of chips that can be die-bonded at one time and thereby reduce the die bonding time. However, this leads to a great reduction in the number of lead frames that can be obtained per unit volume of the material, resulting in increased material cost (see, e.g., Japanese Patent Laid-Open No. 06-007990).

A QFN package manufacturing process that molds a plurality of packages together currently includes a die bonding process in which the semiconductor chips are subjected to high temperature conditions for a long time. During this die bonding process, the solder layer for bonding the semiconductor chips is exposed to elevated temperature and hence is in a liquid state until a predetermined number of chips are die-bonded. When the solder is in a liquid state, it rapidly forms an inter-metallic compound, since its diffusion rate is very high between metals.

For example, assume that the back side of the semiconductor chip is composed of Ni/Au, the lead frame side is composed of Cu/Ni/Au, and a solder composed of AuSn is used as the die bonding material. In this case, the solder of AuSn forms an inter-metallic compound of Sn—Ni with Ni included in the semiconductor side and in the lead frame side.

However, when the solder of AuSn is in a liquid state as described above, the formation of the inter-metallic compound rapidly proceeds. Therefore, the solder diffuses to the base material Cu of the lead frame through the Ni plating. As a result, voids corresponding to the volume of the solder that has diffused to the Cu base material are formed within the solder layer, resulting in an increase in the thermal resistance of the semiconductor chip and a large reduction in the bonding strength.

FIGS. 9 and 10 illustrate these problems. Specifically, FIG. 9 shows the structure of a conventional semiconductor chip. Referring to FIG. 9, reference numeral 1 denotes GaAs, 2 denotes Ni, and 3 denotes Au. FIG. 10, on the other hand, shows a vertical cross-sectional view of a package in which the semiconductor chip shown in FIG. 9 is die-bonded to a lead frame through application of excessive heat. Referring to FIG. 10, reference numeral 4 denotes a solder formed of AuSn, 5 denotes voids, and 6 denotes the lead frame. Thus, in a conventional soldering method, voids are formed within the solder layer, resulting in reduction in the bonding strength and an increase in the thermal resistance.

SUMMARY OF THE INVENTION

The present invention has been devised to solve the above problems. It is, therefore, an object of the present invention to provide a semiconductor device and a die bonding method therefor capable of reducing voids formed in the solder joint portions to prevent an increase in the thermal resistance, as well as to prevent a reduction in the strength of the solder joint portions and thereby maintain their reliability.

According to one aspect of the present invention, a semiconductor device comprises a semiconductor substrate, a first metal film formed on a back surface of the semiconductor substrate, a second metal film formed on the first metal film, and a third metal film formed on the second metal film. The first metal film forms an alloy with a solder. The second metal film causes isothermal solidification of the solder. The third metal film is for improving solder wetting property or for inhibiting oxidation.

According to another aspect of the present invention, in a method for die-bonding a semiconductor device, a specific type of metal is diffused into a solder, when a solder melts, to transform the solder into a high melting point metal compound, thereby causing isothermal solidification of the solder. The specific type of metal is different from the metal of the solder.

Thus, the present invention provides a semiconductor device and a die-bonding method therefor capable of reducing voids formed in the solder joint portions to prevent an increase in the thermal resistance, as well as to prevent a reduction in the strength of the solder joint portions. Accordingly, the present invention leads to improving the quality of semiconductor devices and reducing their cost.

Other and further objects, features and advantages of the invention will appear more fully from the following description.

PREFERRED EMBODIMENTS OF THE INVENTION

Preferred embodiments of the present invention will be described with reference to FIGS. 1 to 8.

First Embodiment

FIGS. 1 to 5 show a semiconductor device and a die bonding method therefor according to a first embodiment of the present invention.

In a die bonding process for a semiconductor chip, the chip is usually subjected to an elevated temperature higher than the melting point of the solder, causing the solder layer to assume a liquid state. As a result, the diffusion rate of the solder becomes extremely high, leading to "abnormal diffusion" of the solder and formation of voids. To prevent this from occurring, the diffusion rate of the solder must be reduced to prevent formation of voids. This requires that, when the die bonding has been completed, the melting point of the solder be increased to higher than the die bonding temperature so that the solder returns to a solid state.

To achieve this, according to the present embodiment, a solder bonding layer metal is formed on the back surface of the semiconductor chip, and a special metal for elevating the melting point of the solder is added to the solder bonding layer metal. When the semiconductor chip having such metals on its back surface is die-bonded, the special metal diffuses within the solder and, as a result, the solder assumes an "isothermal solidification state". Since the solder becomes to a solid state, its diffusion rate is low even under high temperature conditions, thus preventing formation of voids.

This technique will be specifically described with reference to FIG. 1.

Figure 1:
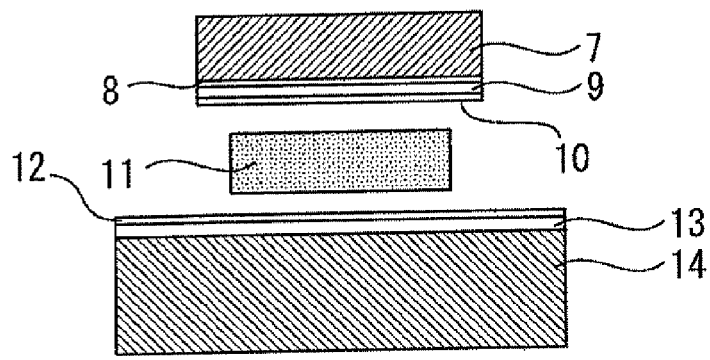
FIG. 1 is a cross-sectional view showing a chip structure of a semiconductor device according to the first embodiment of the present invention, and a cross-sectional view of a lead frame to which the semiconductor chip is soldered.

FIG. 1 is a cross-sectional view showing a chip structure of a semiconductor device according to the first embodiment of the present invention. FIG. 1 also shows a cross-section of a lead frame to which the semiconductor chip is soldered.

Referring to the figure, a semiconductor chip or a semiconductor device comprises a semiconductor substrate 7, a solder bonding layer metal 8 as a first metal film, a melting point elevating metal 9 as a second metal film, a metal 10 as a third metal film for improving solder wetting property or for inhibiting oxidation. The first metal film 8 is formed on the back surface of the semiconductor substrate 7. The second metal film 9 is formed on the first metal film 8. The third metal film 10 is formed on the second metal film 9.

Reference numeral 11 shows a solder.

A lead frame includes oxidation inhibiting metal plating 12, solder-bonding layer metal plating 13 and a lead frame base metal 14.

When the solder 11 is formed of AuSn, the solder bonding layer metal 8 of Ni, the melting point elevating metal 9 of Ti, and the metal 10 of Au for improving solder wetting property are formed in that order on the back side of the semiconductor substrate 7.

The solder bonding layer metal Ni 8 is a bonding metal (a metal film) for forming an Sn—Ni alloy with the solder 11 of AuSn. The underlying melting point elevating metal 9 is a metal film used as an additive to transform the solder 11 into a high melting point metal compound when the solder melts under high temperature conditions. Specifically, when the solder 11 is formed of AuSn, the melting point elevating metal Ti 9 diffuses into the solder 11 and thereby elevates the melting point of the solder 11, so that the solder 11 assumes an "isothermal solidification state". The metal Au 10 for improving solder wetting property or inhibiting oxidation is a metal film used to prevent oxidation of the solder bonding layer metal 8 and the melting point elevating metal 9, as well as to improve the wetting between these metals and the solder 11.

The die bonding process will now be described. First, a lead frame made up of the oxidation inhibiting metal plating 12, the solder-bonding layer metal plating 13, and the lead frame base metal 14 is set above a heater at approximately 310° C. Then, the solder 11 is placed at a predetermined die bonding position. After the solder 11 melts, a semiconductor chip having the above metal composition is mounted on it.

There will now be described how the semiconductor chip is bonded to the lead frame after the above mounting step.

Figure 2:
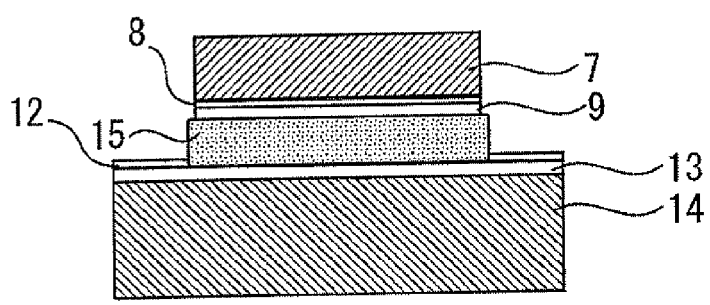
FIG. 2 shows a state where the metal Au is diffused into the AuSn solder.

In FIG. 2, reference numeral 15 shows a state where the metal 10 for improving solder wetting property is dissolved into the solder 11. FIG. 2 shows that the metal Au 10, shown in FIG. 1, for improving solder wetting property, which is the first to come into contact with the solder 11 of AuSn instantaneously diffuses within the solder 11.

Figure 3:
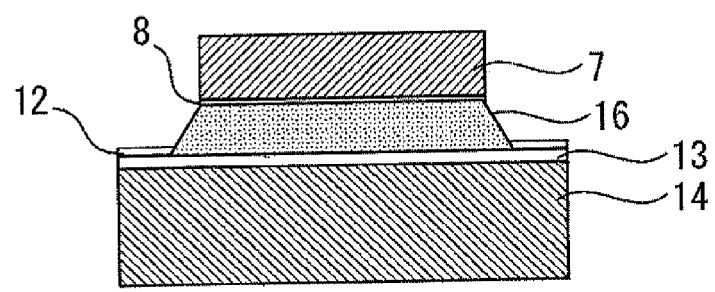
FIG. 3 shows that the melting point elevating metal Ti is in contact with the AuSn solder.

FIG. 3 shows that the melting point elevating metal Ti 9 has come in contact with the solder 11 of AuSn after the metal 10 has diffused into the solder 11. In FIG. 3, reference numeral 16 shows a state where the melting point elevating metal 9 has begun to diffuse into the state 15, i.e. the state in which the metal 10 for improving solder wetting properties is dissolved into the solder 11.

Figure 4:
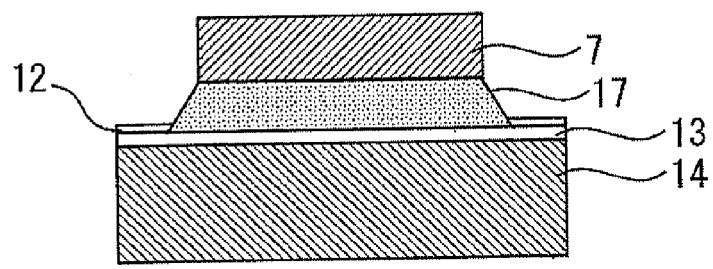
FIG. 4 shows a state where the melting point elevating metal Ti has diffused completely into the AuSn solder.

In FIG. 4, reference numeral 17 shows a state where the melting point elevating metal 9 has diffused completely into the state 15, i.e. the state in which the metal 10 for improving solder wetting properties is dissolved into the solder 11. When the thickness of the melting point elevating metal layer 9 is small, the substantially entire portion of the metal layer 9 diffuses into the state 15 i.e. into the solder 11, as shown in FIG. 4. It should be noted that adding a trace amount of Ti to Sn in the solder 11 of AuSn results in a significant increase in the melting point.

Figure 5:
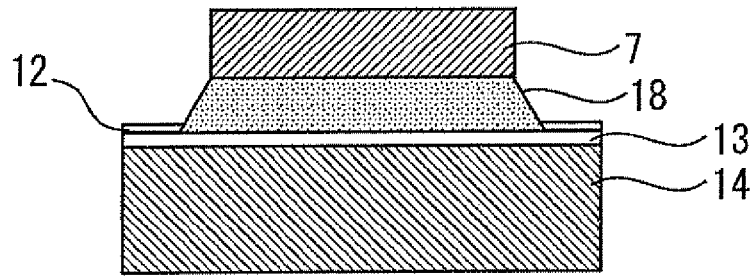
FIG. 5 shows a state where the AuSn solder and the solder bonding layer metal Ni has formed an Sn—Ni alloy layer.

In FIG. 5, reference numeral 18 denotes the finally formed Sn—Ni inter-metallic compound layer. Eventually, the solder 11 forms an Sn—Ni alloy layer 18 with the solder bonding layer metal 8, completing the bonding process, as shown in FIG. 5.

Thus, according to the present embodiment, a melting point elevating metal Ti diffuses into the solder 11, causing the melting point of the solder 11 to increase. As a result, the solder 11 assumes a solid state and remains in this state even at a heater temperature of 310° C. The solder 11 in this state does not significantly diffuse even when the semiconductor chip is left at elevated temperature for a long time, preventing formation of excessive inter-metallic compounds. Therefore, no voids are formed within the solder joint portion, thus preventing an increase in the thermal resistance and hence maintaining reliability of the solder joint portion.

A Ti content of $10^{-4}$ wt % or more should be diffused in the solder 11 of AuSn, since if the Ti content is low, the melting point of the solder 11 does not sufficiently increase and hence isothermal solidification of the solder 11 does not occur.

Second Embodiment

Figure 6:
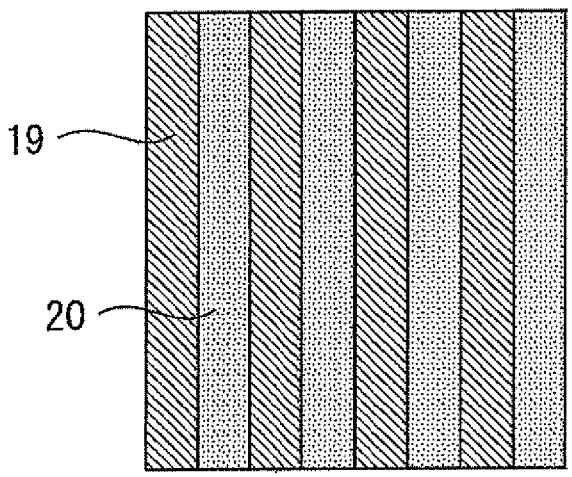
FIG. 6 shows the back surface of the semiconductor chip with the oxidation inhibiting metal removed in a second embodiment of the present invention.
Figure 7:
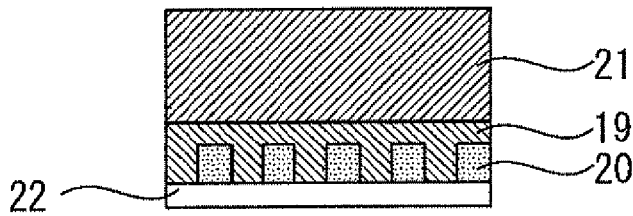
FIG. 7 shows a cross-sectional view of the semiconductor chip.

FIGS. 6 and 7 show a semiconductor device and a die bonding method therefor according to a second embodiment of the present invention. Although the first embodiment has been described with reference to the case where the melting point elevating metal 9 is Ti, the melting point elevating metal 9 may be Pt with the same effect.

According to the present embodiment, the melting point elevating metal 9 is deposited in stripes on the back surface of the semiconductor chip to allow the metal to uniformly diffuse into the solder.

FIG. 6 shows the back surface of the semiconductor chip with the oxidation inhibiting metal 22 removed, and FIG. 7 shows a cross-sectional view of the semiconductor chip.

Referring to FIGS. 6 and 7, the semiconductor chip comprises a melting point elevating metal 19, a solder bonding layer metal 20; a semiconductor substrate 21, and a metal 22 for improving solder wetting property or inhibiting oxidation. This arrangement allows the melting point elevating metal 19 to uniformly diffuse also to the lead frame side.

According to the present embodiment, the melting point elevating metal 19 is Pt. Therefore, as in the first embodiment, the solder 11 does not significantly diffuse even when the semiconductor chip is left at elevated temperature for a long time, preventing formation of excessive inter-metallic compounds. As a result, no voids are formed within the solder joint portion, thus preventing an increase in the thermal resistance and hence maintaining reliability of the solder joint portion.

Third Embodiment

Figure 8:
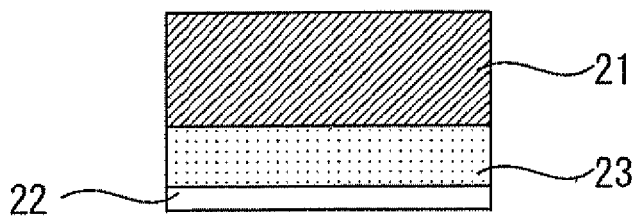
FIG. 8 shows a cross-sectional view of a semiconductor chip of a semiconductor device according to a third embodiment of the present invention, in which powdered metal having melting point elevating effect is uniformly mixed in the solder bonding layer.
Figure 9:
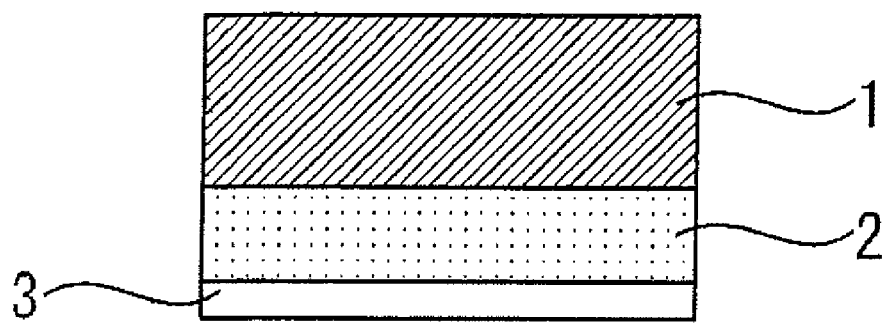
FIG. 9 shows a structure of a conventional semiconductor chip.
Figure 10:
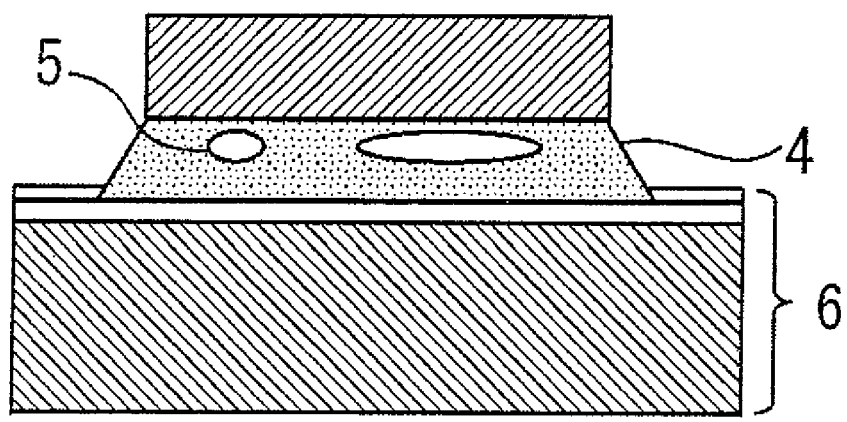
FIG. 10 shows a vertical cross-sectional view of a conventional package using a conventional semiconductor chip.

FIG. 8 shows a cross-sectional view of a semiconductor chip of a semiconductor device according to a third embodiment of the present invention. In this semiconductor device, powdered metal having a melting point elevating effect is uniformly mixed in the solder bonding layer.

Referring to FIG. 8, the semiconductor chip comprises a semiconductor substrate 21 and a solder bonding layer metal 23 uniformly containing the melting point elevating metal 19 of the second embodiment. Reference numeral 22 shows a metal for improving solder wetting property or inhibiting oxidation.

Thus, according to the present embodiment, in the solder bonding layer metal 23, the melting point elevating metal 19 is powdered and mixed in the solder bonding layer metal 20 to allow the melting point elevating metal 19 to uniformly diffuse into the solder.

Thus, the present embodiment has the same effect as the second embodiment. Furthermore, since the melting point elevating metal 19 is powdered and uniformly mixed in the solder bonding layer, the reliability of the bonding process is enhanced, resulting in an increase in the quality of the semiconductor device.

Fourth Embodiment

In a fourth embodiment, a method for die-bonding a semiconductor device is described.

In a method for die-bonding a semiconductor device according to the fourth embodiment, a specific type of metal is diffused into a solder when the solder melts, and transform the solder into a high melting point metal compound. The specific type of metal is different from the metal of the solder. Thereby, isothermal solidification of the solder is caused.

The solder contains at least Au or Sn, and the specific type of metal is preferably selected from the group consisting of Ti, Pt, Mo, V, and Nb. Further, the specific type of metal is preferably diffused into the solder at ratio between $1.0 \times 10^{-4}$ wt % and 20 wt %, inclusive.

By this process, a melting point elevating metal Ti diffuses into the solder, causing the melting point of the solder to increase. As a result, the solder 11 assumes a solid state and remains in this state even at a heater temperature of 310° C. The solder 11 in this state does not significantly diffuse even when the semiconductor chip is left at elevated temperature for a long time, preventing formation of excessive inter-metallic compounds. Therefore, no voids are formed within the solder joint portion, thus preventing an increase in the thermal resistance and hence maintaining reliability of the solder joint portion.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-363730, filed on Dec. 16, 2005 including specification, claims, drawings and summary, on which the Convention priority of the present application is based, are incorporated herein by reference in its entirety."

The invention claimed is:

1. A semiconductor device mounting arrangement comprising:
   a semiconductor substrate including opposed front and back surfaces;
   a metallic lead frame for bonding to said rear surface of said semiconductor substrate;
   AuSn solder interposed between said back surface of said semiconductor substrate and said lead frame;
   a first metal film of Ni forming an alloy with said AuSn solder, said first metal film contacting said back surface of said semiconductor substrate;
   a second metal film of Ti producing isothermal solidification of said AuSn solder, said second metal film being interposed between said AuSn solder and said first metal film and contacting said first metal film; and
   a third metal film of Au, improving solder wetting properties, said third metal film being interposed between and contacting said second metal film and said AuSn solder.

2. The semiconductor device mounting arrangement according to claim 1, wherein said lead frame comprises:
   a base metal; and
   an oxidation-inhibiting metal layer and a solder-bonding metal layer on said base metal and interposed between said base metal and said AuSn solder.

* * * * *